United States Patent [19]

Kosonocky et al.

[11] Patent Number: 4,544,939

[45] Date of Patent: Oct. 1, 1985

[54] SCHOTTKY-BARRIER DIODE RADIANT ENERGY DETECTOR WITH EXTENDED LONGER WAVELENGTH RESPONSE

[75] Inventors: Walter F. Kosonocky, Skillman; Hammam Elabd, Cranbury, both of N.J.

[73] Assignee: RCA Corporation, New York, N.Y.

[21] Appl. No.: 296,226

[22] Filed: Aug. 25, 1981

[51] Int. Cl.[4] .................... H01L 27/14; H01L 29/48; H01L 31/00; H01L 29/56
[52] U.S. Cl. ........................................ 357/30; 357/15; 357/89; 357/91
[58] Field of Search ................ 357/15 R, 15 P, 30 C, 357/89, 90, 91

[56] References Cited

U.S. PATENT DOCUMENTS

| | | | |
|---|---|---|---|
| 3,964,084 | 6/1976 | Andrews, Jr. et al. | 357/15 |
| 4,045,248 | 8/1977 | Shannon et al. | 148/1.5 |
| 4,046,609 | 9/1977 | Digoy | 357/89 |
| 4,089,020 | 5/1978 | Ikeda et al. | 357/150 R |
| 4,149,174 | 4/1979 | Shannon | 357/15 X |

FOREIGN PATENT DOCUMENTS

| | | | |
|---|---|---|---|
| 55-22812 | 2/1980 | Japan | 357/15 LA |
| 55-150278 | 11/1980 | Japan | 357/15 |

OTHER PUBLICATIONS

R. Taylor et al., "Improved Platinum Silicide IRCCD Focal Plane", *SPIE, Advances in Focal Plane Technology*, vol. 217, (1980), pp. 103–110.

A. Rusu et al., "The Metal–Overlap Laterally–Diffused (MOLD) Schottky Diode", *Solid–State Electronics*, vol. 20, (1977), pp. 489–506.

J. M. Shannon, "Control of Schottky Barrier Height Using Highly Doped Surface Layers", *Solid–State Electronics*, vol. 19, (1976), pp. 537–543.

Primary Examiner—Andrew J. James
Assistant Examiner—J. Carroll
Attorney, Agent, or Firm—Joseph S. Tripoli; George E. Haas; Allen LeRoy Limberg

[57] ABSTRACT

The upper limit of longer wavelength response of a radiation detector using a Schottky-barrier diode operated in hot carrier mode is extended by a layer of relatively high concentration impurities ion implanted in Schottky barrier contact surface of the semiconductive region of the diode.

4 Claims, 8 Drawing Figures

Table 1. THE ENERGY INTERCEPTED BY THE IR DETECTOR FROM A 300K BLACK BODY SOURCE

|  | $\lambda_c = 4.5 \mu M$ | $\lambda_c = 5.0 \mu M$ |
|---|---|---|
| THE TOTAL RADIANT EMITTANCE $(W/cm^2)$ $W = \int_0^\infty W d\lambda$ | $4.59 \times 10^{-2}$ | $4.59 \times 10^{-2}$ |
| $\dfrac{\int_0^{\lambda_c} w d\lambda}{\int_0^\infty w d\lambda}$ | $5.9 \times 10^{-3}$ | $1.29 \times 10^{-2}$ |
| $\dfrac{W(\lambda_c, 300K)}{W_{max}(300K)}$ | 0.153 | 0.262 |

Table 2.

| $p^+$ dopant | $E_i$ (eV) | $\psi_{ms} - E_i$ (eV) | $\lambda_c (\mu m)$ |
|---|---|---|---|
| B | 0.046 | 0.226 | 5.49 |
|   | 0.052 | 0.220 | 5.64 |
|   | 0.084 | 0.188 | 6.60 |
| Ga | 0.07 | 0.202 | 6.14 |
| In | 0.15 | 0.122 | 10.16 |
| Al | 0.057 | 0.215 | 5.77 |

Table 3. APPROXIMATE CUT-OFF WAVELENGTHS AND OPERATING TEMPERATURES FOR SCHOTTKY DETECTORS

| SILICIDE | MEASURED VALUES OF $\Phi_{BN}$ (EV) | CALCULATED VALUES OF | | |
|---|---|---|---|---|
| | | $\psi_{MS}$ (EV) | $\lambda_C$ (μM) | MAX. OPERATING TEMP(K) $J_D = 1.0 \times 10^{-7}$ A/CM$^2$ |
| IrSi | 0.91 | 0.20 | 6.0 | 80 |
| PtSi | 0.88 | 0.24 | 5.2 | 95 |
| Pt$_2$Si | 0.78 | 0.35 | 3.65 | 140 |
| Pd$_2$Si | 0.74 | 0.37 | 3.4 | 145 |
| NiSi | 0.66 | 0.46 | 2.7 | 180 |
| WSi$_2$ | 0.65 | 0.47 | 2.64 | 185 |
| TiSi$_2$ | 0.6 | 0.52 | 2.4 | 200 |

SCHOTTKY-BARRIER DIODE RADIANT ENERGY DETECTOR WITH EXTENDED LONGER WAVELENGTH RESPONSE

The present invention is directed to radiant energy detectors using Schottky-barrier diodes and, more particularly, to ones having extended longer wavelength response, which is provided in each of them by a shallow, highly doped, ion-implanted layer in the semiconductor region immediately adjacent to the Schottky barrier contact with the conductor.

Monolithic platinum silicide (PtSi) Schottky-barrier diode arrays for infra-red sensors have been described by W. F. Kosonocky, H. G. Erhardt, G. Meray, F. V. Shallcross, H. Elabd, M. J. Cantella, J. Klein, L. H. Skolnik, B. R. Capone, R. W. Taylor, W. Ewing, F. D. Shepherd and S. A. Roosild in the paper entitled, "Advances in Platinum Silicide Schottky-Barrier IR-CCD Image Sensors", appearing in SPIE Vol. 225-IR Image Sensor Technology, 69 (1980) and by R. Taylor, L. Skolnik, B. Capone, W. Ewing, F. Shepherd, S. Roosild, B. Cochrun, M. Cantella, J. Klein, W. Kosonocky, in the paper entitled, "Improved Platinum Siicide IRCCD Focal Plane", appearing in SPIE Vol. 217, Advances in Focal Plane Technology 103 (1980). The Schottky-barrier-diode IR sensors are formed on a single high-resistivity p-type silicon (Si) substrate in which charge-coupled device (CCD) shift registers are disposed for transporting the responses of the IR sensors in timed sequence to an output circuit, where they appear as successive samples of a video signal, typically used to control the display of the sensed information in the visible light region on a cathode ray tube monitor.

The present invention concerns such infra-red sensor apparatus, where the Sckottky-barrier diode structure is modified by a more highly doped, lower resistance layer of semiconductive material adjacent to the Schottky-barrier surface. This results in extending the long wavelength spectral response. For example, the response can be lengthened to include the IR photons with energies below the carbon dioxide ($CO_2$) absorption band (4.15 to 4.45 $\mu$m), so as to recognize the thermal signature of jet engines. Further the response can be lengthened to include IR photons with energies corresponding the 8-14 $\mu$m spectral window for imaging through the smoke of a battlefield. A barrier height of about 100 meV results in the device having a cut-off wavelength of about 1.5 $\mu$m, which requires a 130 meV barrier height reduction from the normal PtSi-Si barrier height.

J. M. Andrews, Jr. in U.S. Pat. No. 3,964,084 issued June 15, 1976 and entitled "SCHOTTKY BARRIER DIODE CONTACTS" describes Schottky barrier diodes wherein the Schottky barrier contact includes a thin layer of high carrier concentration impurities ion implanted over the contact surface of the semiconductor. This reduces the electronic barrier height, increases the tunneling component, and thus reduces the forward-bias turn-on voltage of the diode. The implanted layer has a carrier concentration at least ten times that of the semiconductor substrate and a thickness smaller than the width of the inherent depletion region resulting from the internally generated electric field at the metal-semiconductor surface.

J. M. Shannon and J. R. A. Beale in U.S. Pat. No. 4,045,248 issued Aug. 30, 1977 and entitled "MAKING SCHOTTKY BARRIER DEVICES" teach that a thin layer of high doping concentration in the semiconductor material adjacent to the Schottky barrier contact will, if thin enough that the region is substantially depleted of charge carriers in the zero-bias voltage condition, lead to the reverse current-voltage characteristics of the barrier below breakdown voltage being determined by the doping of the bulk of the semiconductive material rather than by the thin layer of highly doped material.

Prior art usage of Schottky barrier devices with shallow ion-implant layers to lower the Schottky barrier has been directed to the use of the Schottky barrier diode as a clamp or rectifier device responsive to extenally applied currents. Despite the technique for lowering Schottky barrier potential without concomitant loss of control of reverse-bias current having been known for half a decade, its effects upon the Schottky barrier diode as a radiation detector for generating charge carriers responsive to impinging photons have not been considered. The Schottky barrier diode as a detector of infra-red radiation has been widely faulted by those skilled in IR sensing and imaging for its lack of response for longer wavelengths in that portion of spectrum. The flat reverse-current characteristic of the Schottky barrier diode with the shallow ion implantation layer near the Schottky barrier contact, the present inventors point out, means dark current can be kept under control in radiation detectors using Schottky barrier diodes while obtaining reduced barrier potentials that widen the spectral window of these detectors to admit longer wavelengths of radiation.

A radiation detector embodying the present invention, then, includes a region of semiconductive material relatively lightly doped in its bulk and a region of conductive material, which regions have respective ohmic contacts to them and have a Schottky barrier contact at a shared surface between them. This structure is arranged for operation in a hot carrier mode to provide photoemission of charge carriers responsive to radiation entering the region of semiconductive material. The extension of longer wavelength response, the improvement in the radiation detector which characterizes the invention, is obtained from a layer of substantially heavier doping concentration in a portion of the region of semiconductive material immediately adjoining its surface making Schottky barrier contact with the conductive region. This layer is sufficiently thin as to be substantially depleted during operation, which reduces the barrier potential by a substantially constant amount despite changes in potential between the contacts to the regions of semiconductive and conductive materials.

In the drawings.

TABLE 1 shows the increase in radiation detector efficiency insofar as detecting the energy radiated by a 300° K. black body that can be obtained by the cut-off wavelength being lengthened from 4.5 to 5.0 μm.

TABLE 2 tabulates the Schottky-barrier lowering, resultant barrier potential, and cut-off wavelength for various p+ dopants in the shallow implant layer next to the Schottky-barrier surface; and TABLE 3 tabulates the approximate cut-off wavelengths and operating temperatures for various Schottky barrier IR detectors embodying the invention.

A preferred embodiment of the invention is an infrared (IR) detector which uses a Schottky-barrier diode between a layer of platinum silicide (PtSi) formed on a substrate of p-type silicon. Such a Schottky-barrier diode (SBD) is characterized by a low electric barrier. Photoelectric measurements indicate that the barrier is 0.272 eV under no bias conditions. The spectral window of an infra-red detector comprising an array of such diodes formed on a common silicon (Si) substrate lies between 1.0 and 4.55 μm, when the detector is illuminated through the substrate.

Figure 1:
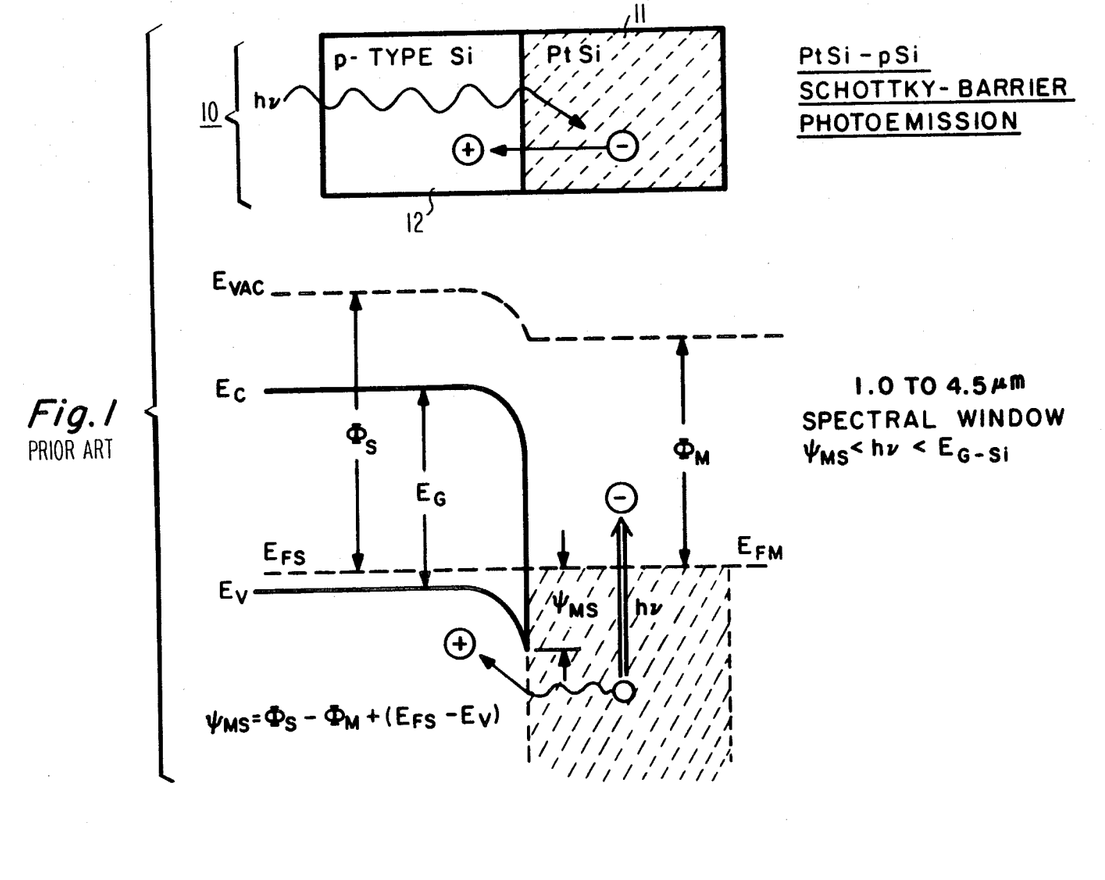
FIG. 1 is a composite figure showing, at top, a stylized Schottky-barrier diode cross-sectional view and, below, an energy band diagram drawn to the same horizontal scale, indicative of prior art practice.

The PtSi-p Si Schottky barrier is used as an infrared detector in the hot carrier mode, where the photon absorption takes place in the thin silicide layer, or film, 11 of the stylized Schottky barrier 10 shown the upper portion of FIG. 1. (The lower portion of FIG. 1 shows the associated energy band diagram).

IR-photons in the spectral window between the electric barrier and the Si-bandgap are absorbed in the PtSi film 11, where hole-electron pairs are generated.

Holes with sufficient energies (hot holes) are emitted across the barrier into the Si-substrate 12, thus generating the photocurrent. The photocurrent is given by equation 1, following.

$$I_P = q Y n_{ph} A \qquad (1)$$

Here, q is the unit electron charge, Y is the photoyield or external quantum efficiency, $n_{ph}$ is the incident photon flux density within the spectral window and A is the detector area. The photoyield for photoemission of holes can be represented by equation 2, following.

$$Y = C_1 \frac{[h\nu - \psi_{ms}]^2}{h\nu} \quad \frac{\text{electrons}}{\text{photons}} \qquad (2)$$

Here $C_1$ is the quantum efficiency coefficient [eV$^{-1}$], and is determined by the geometry and stochiometry of the PtSi film, $\psi_{ms}$ is the barrier height, h is Planck's constant and $\nu$ is the photon frequency. From equations (1) and (2) the responsivity can be evaluated and is given by equation (3), following, wherein λ is the wavelength in microns of the photon radiation.

$$R_\lambda = C_1 \left(1 - \frac{\psi_{ms}\lambda}{1.24}\right)^2 \qquad (3)$$

Besides the photocurrent, leakage or dark current flows across the barrier. This dark current in accordance with thermionic emission theory is given by equation 4 following:

$$J_D = A^* T^2 e^{-q\psi_{ms}/KT} \qquad (4)$$

where A* is the emission constant for holes in silicon (and ideally equals 32 A/cm$^2$ K$^2$), K is the Boltzmann constant, and T is the detector temperature.

The potential near the interface is determined by the surface field of the SBD and the image force potential experienced by a hole leaving the PtSi film. The superposition of these two effects results in the barrier lowering of the Schottky emission, which is given by equation (5) following.

$$\Delta\Psi = \left[\frac{q^3 E}{4\pi\epsilon}\right]^{\frac{1}{2}} = \beta(NW)^{\frac{1}{2}} \qquad (5)$$

Here, $\epsilon$ is the optical dielectric constant, E is the applied electric field in V/cm, $\beta$ is a proportionality factor, N is the boron concentration in the depletion region, W is the width of the depletion region, and NW is the total impurity dose. Implanting the Si-surface with boron increases the field and the barrier lowering for the same applied voltage. The magnitude of the barrier lowering can be varied by varying the implant dose and range.

Figure 2:
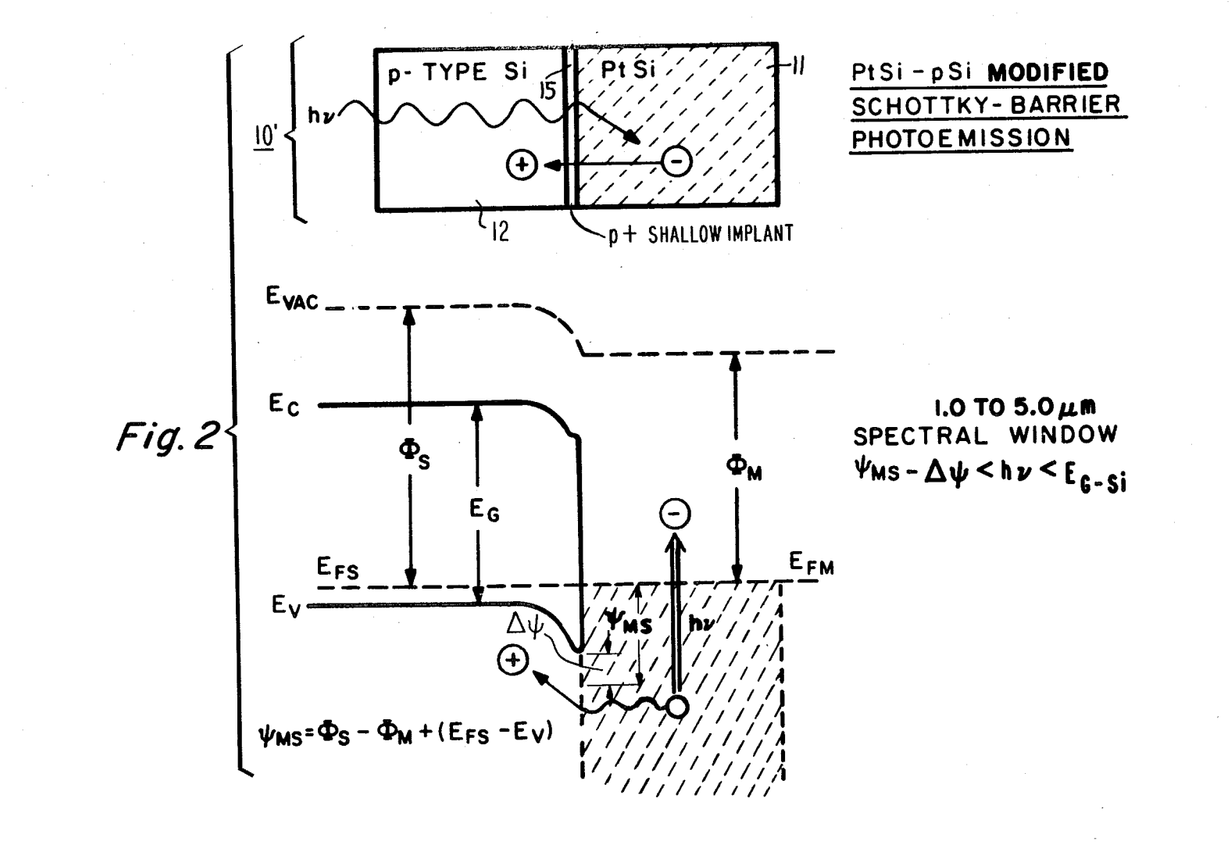
FIG. 2 is a similar composite figure in which the stylized Schottky-barrier diode cross-sectional view is modified according to the present invention to include a shallow ion implant layer region of heavy doping in the semiconductor structure next to the Schottky-barrier and in which the energy band diagram is accordingly modified.

Modification of the FIG. 1 infra-red detector to include a shallow ion implanted p+ layer 15 at the PtSi and p Si interface, (as shown in the upper portion of FIG. 2) lowers the barrier by $\Delta\psi$ for the photoemission of carriers (as shown in the lower portion of FIG. 2) and thus extends the long wavelength spectral response of the Schottky-barrier detector. Changing the implant dose will change the resulting barrier height to $\psi_{ms} - \Delta\psi$. A shallow implant with an acceptor concentration between $10^{16}$–$10^{17}$/cm$^3$ results in a longer cut-off wavelength of approximately 5 μm. This is quite significant since the energy emitted by 300K black body source increases rapidly in this wavelength region, as shown in Table 1. The increase in the photon absorption due to the wider spectral window will result in a proportional increase in the diode sensitivity. A PtSi-Si IR detector with extended long wavelength spectral response is particularly useful in "hot target" identification which requires response to wavelengths between 4.0 and 5.0 μm. Such a hot target might be a jet engine exhaust, for example.

The reason for making the region of highly doped acceptor material next to the Schottky barrier surface thin—i.e. for making the ion implant layer thin—is so that the surface electric field tends not to change so much as the voltage across the detector diode varies. This keeps the $\Delta\psi$ barrier potential lowering more constant as voltage applied across the detector diode changes, so there is not a strong variation in dark current as a function of this applied voltage. Accordingly, there will be lessened need for cooling the detector and carefully regulating its applied voltage in order to keep dark current acceptably low.

Two mechanisms are responsible for the barrier lowering. Firstly, the enhanced electric field at the interface as a result of increased doping concentration will cause Schottky barrier lowering and thermally asisted tunneling. Secondly, in the degenerate doping case there are more allowed states in the band-gap due to the overlap of the acceptor band with the valence band (impurity tail). Using different dopants (e.g. B, Ga, In, Al, . . . ) in a degenerate layer below the PtSi-Si interface will alter the distribution of the allowed states in the energy gap at the depleted surface. This causes different barrier reductions and can extend the detector spectral range to the far IR (8-14 μm). TABLE 2 demonstrates the resulting barrier $\psi_{ms}-E_i$ and cut-off wavelength ($\lambda_c$) due to an impurity tail which is assumed to exist between the valence band and the ionization energy of the particular impurity in Si. The cut-off wavelengths for boron doping are caculated from three values of its ionization potential $E_i$ measured by different investigators.

As previusly noted, the Schottky-barrier IR detectors when used in IR-responsive imagers can be arranged in an array disposed on a Si substrate which also has disposed thereon charge-coupled-devices (CCD's) for commutating the individual detector responses into a video signal, suitable as a basis for raster-scanned display of the imager responses. In such instances the operation of a detector with a reduced barrier may require cooling to below 77k to lower the dark current, which would otherwise fill the CCD potential wells.

The lower limit of the dark current of a Schottky-barrier detector is that due to internal thermionic emission of holes from the PtSi over the barrier into the Si substrate. The current density $J_{TH}$ due to thermionic emission as determined according to equation (4) has a value of $1.245 \cdot 10^{-12}$ A/cm$^2$ when $\psi_{ms}=0.272$ eV, $A^*=32$ A/cm$^2$ K$^2$, and T=77K. The maximum tolerable dark current density is that which causes an appreciable voltage swing (e.g. 1 V) at the surface potential of the CCD well. Calculations suggest that this corresponds to a current density of $2.7 \times 10^{-7}$ A/cm$^2$. Hence with any barrier lowering, a lower maximum operating temperature is set for the operation of the PtSi-Si detector. Taking $\psi_{ms}=0.272$, we calculate:

| $\lambda_c$ (μm) | $\Delta\psi$ (eV) | $T_{max}$ |
|---|---|---|
| 4.56 | 0 | ~110 K |
| 4.92 | 0.02 | ~101 K |
| 5.35 | 0.04 | ~92 K |
| 5.85 | 0.06 | ~83 K |

The Schottky barrier lowering $\Delta\psi$ can be evaluated from the surface electric field E and the optical dielectric constant of Si per equation 5. If the implant depth D is larger than the depletion region width W, then the surface field can be computed from the abrupt junction approximation at equation (6) following.

$$E = \frac{2V_j}{W} = \frac{q}{\epsilon} N_i W \quad (6)$$

Here, $V_j$ is the vacuum level bending potential and W is the depletion region width which is a function of the acceptor concentration $N_i$ in the implant.

For a shallow implant D<W the following value of surface electric field obtains.

$$E = q/\epsilon[N_i D + N_s(W-D)] \quad (7)$$

Here, $N_i$ and $N_s$ are the acceptor concentrations in the implant and in the substrate, respectively.

Figure 3:
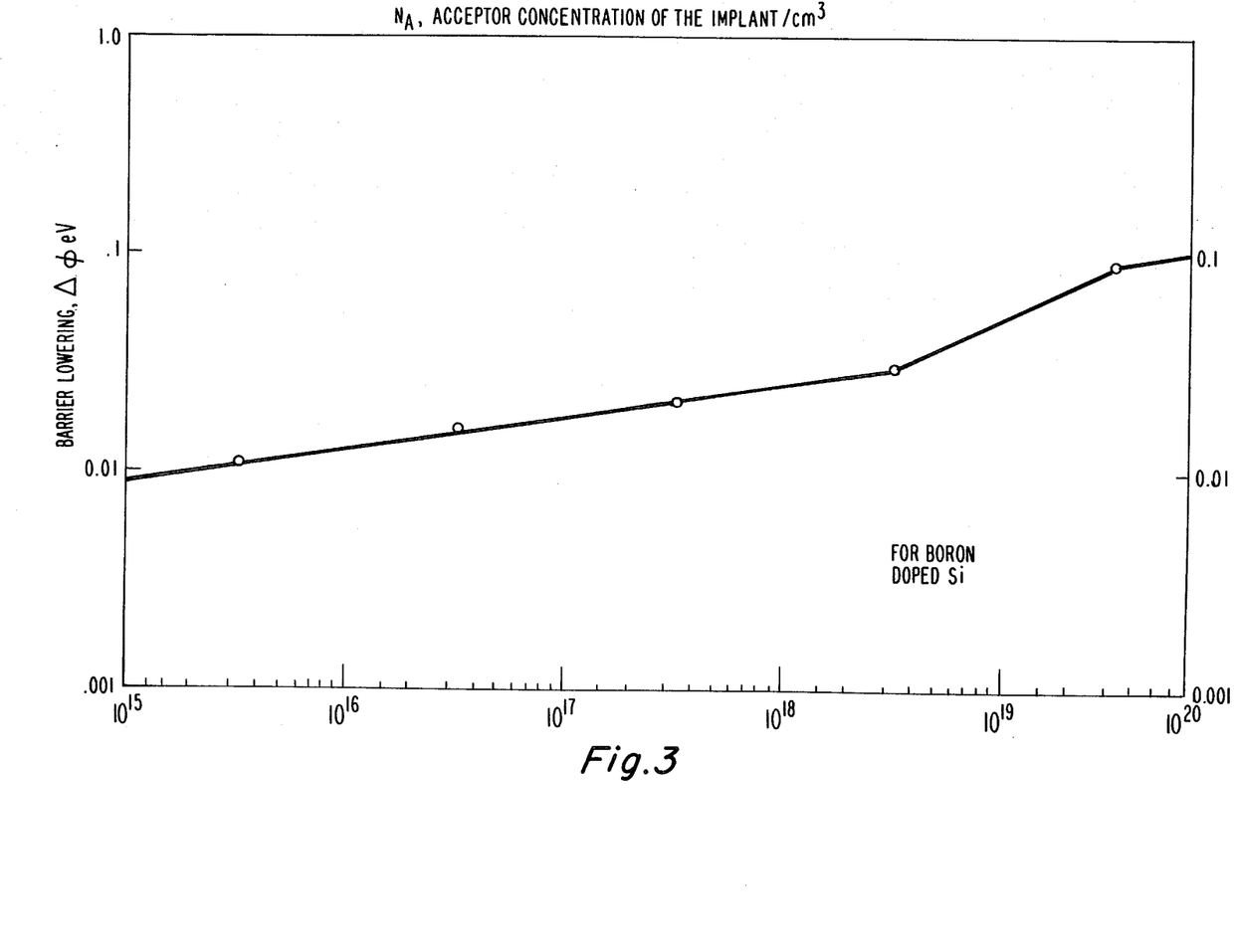
FIG. 3 is a plot of estimated Schottky-barrier voltage lowering as a function of the doping level of the shallow ion implant layer region.
Figure 4:
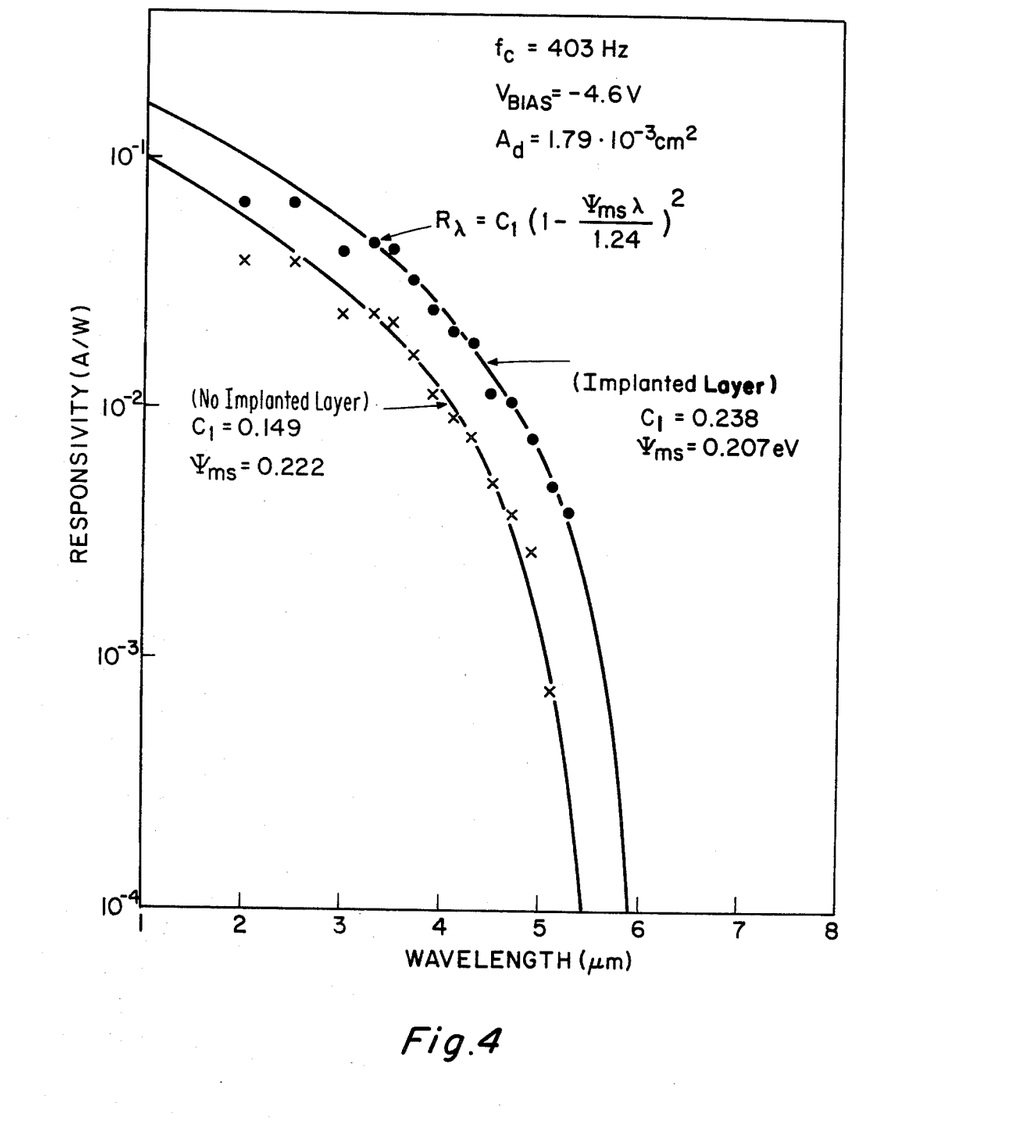
FIG. 4 is a plot of the changes in spectral response curve caused by the shallow ion implant layer.

A quantitative estimate of the barrier lowering as a function of $N_i$ is plotted in FIG. 3, using equations (4) and (5) for 77K device temperature. FIG. 4 demonstrates the change in the spectral response curve achieved with the lowered barrier provided by the ion implanted layer at high doping concentration in the semiconductor next to its Schottky barrier contact.

While the PtSi-Si Schottky-barrier diode has been specifically considered because of its low electric barrier, the invention is of practical importance with regard to Schottky-barrier diodes using other semiconductive and conductive material interfaces.

Schottky-barrier diode IR detectors may be formed using such metal silicides, as IrSi, Pt$_2$Si, Pd$_2$Si, NiSi, WSi$_2$, and TiSi$_2$, for example. Every one of these metal silicides forms a Schottky barrier with the Si substrate. The height of the barrier, $\psi_{ms}$ is different for each of these silicides. The corresponding cut-off wavelength $\lambda_c$ and maximum operating temperature for each of the corresponding Schottky diode arrays differs as tabulated in TABLE 3, in which the cut-off wavelength is given by $$\lambda_c = 1.24/\psi_{ms} \quad (8)$$

$\lambda_c$ is in μm where $\psi_{ms}$ is the barrier height in eV and $\lambda_c$ is the cut-off wavelength in microns. Prior art Schottky-barrier junctions have been made using n-type silicon, and values of barrier height $\Phi_{NB}$ for this semiconductive material are readily available in the literature. The Schottky barrier height $\psi_{MS}$ for p-type silicon can be calculated by subtracting $\Phi_{NB}$ from the band-gap voltage or $E_g$ of silicon. $\Phi_{NB}$ is larger than $E_g/2$ so $\psi_{MS}$ is smaller than $E_g/2$, and the choice of p-type silicon as the semiconductive material for the Schottky-barrier junction radiation detector extends its long wave response. The cut-off wavelengths between those of different silicides can be obtained by using a shallow ion-implanted layer to extend the longer wavelength response of Schottky diodes using silicides with shorter cut-off wavelengths absent the ion-implanted layers. One may choose a palladium-silicide (Pd$_2$Si), silicon interface with ion implanted layer to achieve cut-off wavelength longer than 6 μm in an IR detector, for example, because of reduced edge leakage or improved responsivity.

Figure 5:
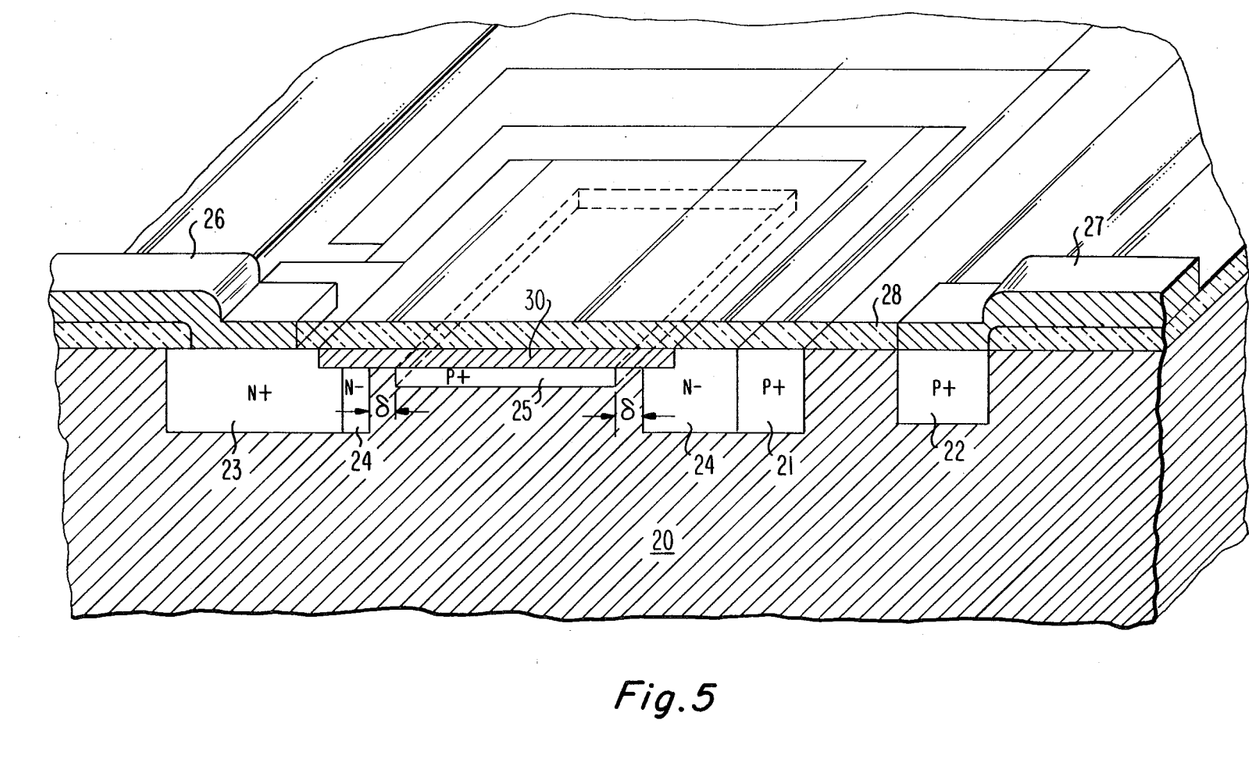
FIG. 5 is a view of the Schottky barrier diode structure embodying the present invention, cut away to reveal the cross-section of the structure with the vertical dimension greatly expanded at its upper surface compared to its other dimensions, per the convention for cross-sections of semiconductor devices.

FIG. 5 shows a cut-away view of the Schottky-barrier-diode portion of an IR radiation detector with extended longer wavelength response. Such detectors have been constructed suing test diodes of $1.79 \cdot 10^{-3}$ cm$^2$ area fabricated on a p-type, <100> crystalline axis Si substrate 20 with resistivities in the range of 25 to 50 ohm-cm. In the first level of the fabrication process after initial processing of the semiconductor wafer the p+ channel stop 21 and the ohmic contact 22 to semiconductive substrate 20 are ion-implanted. (The placement of ohmic contact 22 to substrate 20 is non-critical and is chosen here for purposes of clarity of illustration.) In the second level of the fabrication process the n+ diffusion is emplaced for forming ohmic contact 23 for the conductive region of the Schottky barrier diode. In the third level of the fabrication process an n- ion implantation provides a guard ring 24 surrounding the Schottky barrier junction and abutting the p+ channel stop 21. The high resistivity n type guard ring 24 and p type channel stop 21 reduce the leakage current of the detector diode to other, nearby devices in substrate 20. Guard ring 24 completely surounds the diode, and the p+ channel stop 21 surrounds the diode except near the n+ ohmic contact, which is subsequently connected to the gate electrode of the CCD device used to transfer charge carriers away from the detector diode.

In the fourth level of the process the shallow p+ ion implantation 25 is made to a depth of 1000 Angstroms, the implant dose being adjusted dependent on the desired cut-off wavelength. As noted before, the shallowness of this implant is such that this region is totally depleted at zero reverse voltage to preclude increase in dark current as voltage across the diode changes. This is particularly important in the context of imagers using CCD registers to transfer charge carriers away from the radiation detector diodes, since in accordance with Coulomb's Law the voltage on the CCD gate receiving these charge carriers varies as the integral of the number of those charge carriers and is therefore far from constant. Making the perimeter of this ion-implantation layer 23 smaller on each side than the detector window defined by the surrounding guard ring 24 by a distance δ of two to five μm causes in the finished device a surface of lower-Schottky-barrier potential completely surrounded by an annular surface of higher-Schottky-barrier potential. This is a preferable construction since it reduces fringing field effects upon the lowered Schottky-barrier potential. The silicon substrate is then annealed in 1050° C. helium atmosphere for somewhat less than an hour to remove surface damage.

In the fifth level of the fabrication process the detector window is opened and a thin Pt film is deposited by evaporation or sputtering to form the conductive material region 30 of the Schottky barrier diode. The Pt film is then annealed at low temperatures (320°–350° C.) to form a clean PtSi-Si junction below the original Si surface.

Conventional silicon dioxide (SiO$_2$) layer growth, opening of contact windows in the SiO$_2$ protective layer 28, and deposition of metalization 26, 27 follows. Metalization 26 from the ohmic contact 23 to the PtSi typically is extended into the gate structure of a CCD shift register stage in arrays of the IR detectors.

What we claim is:

1. In a radiation detector for operation at temperatures low enough to avoid excessive dark current including a region of semiconductive material relatively lightly doped in its bulk and a region of a conductive material, which have respective ohmic contacts thereto and share a surface therebetween at which a Schottky-barrier contact is made, arranged for operation in a hot carrier mode to provide photoemission of charge carriers responsive to radiation entering said region of semiconductive material, the improvement for extending longer wavelength spectral response of the photoemission process wherein the doping type of said semiconductive material is such as to make the Schottky-barrier potential at said Schottky-barrier contact less than half band gap voltage for that semiconductor material and wherein a layer of substantially higher doping concentration is formed in a portion of said region of semiconductive material immediately adjoining the surface at which said Schottky-barrier contact is made, which layer is of such thinness as to be substantially depleted of charge carriers during said operation and has a doping concentration chosen to lower the Schottky-barrier potential without undue increase in the dark current at the temperature of operation.

2. A radiation detector of the type described in claim 1 wherein said doped semiconductive material is p type silicon; wherein said conductive material is chosen from a group consisting of platinum silicide, palladium silicide, iridium silicide, tungsten silicide, nickel silicide and titanium silicide; and wherein said layer of substantially higher doping concentration is doped with a dopant chosen from the group consisting of boron, gallium, indium and aluminum.

3. A radiation detector of the type described in claim 1 or 2 wherein said layer of substantially higher doping concentration does not extend to the edges of the surface at which a Schottky barrier junction is formed, for introducing a guard ring of higher-potential-Schottky-barrier surface surrounding the area of lower-potential-Schottky-barrier surface, thereby to reduce the dependence of the lower Schottky-barrier potential on fringing field effects.

4. A radiation detector of the type described in claim 1 wherein said doped semiconductive material is p type silicon; wherein said conductive material is chosen from a group consisting of platinum silicide, palladium silicide, iridum silicide, tungsten silicide, nickel silicide and titanium silicide; and wherein said layer of substantially higher doping concentration is doped with a dopant which is p type in silicon.

* * * * *